FREQUENCY CONTROL APPARATUS

Filed March 1, 1963 3 Sheets-Sheet 1

INVENTOR.
JAMES A. MOULTON
BY Rolf M. Pitts
ATTORNEY

INVENTOR.
JAMES A. MOULTON
BY Roy M. Pitts
ATTORNEY

Aug. 2, 1966 J. A. MOULTON 3,264,565

FREQUENCY CONTROL APPARATUS

Filed March 1, 1963 3 Sheets-Sheet 3

INVENTOR.
JAMES A. MOULTON
BY Rolf M. Pitts
ATTORNEY

United States Patent Office 3,264,565

Patented August 2, 1966

3,264,565

FREQUENCY CONTROL APPARATUS

James A. Moulton, Santa Ana, Calif., assignor to North American Aviation, Inc.

Filed Mar. 1, 1963, Ser. No. 261,980

12 Claims. (Cl. 325—420)

The subject invention relates to frequency control apparatus and more particularly to automatic means for controlling the IF frequency of an electrical system.

In the design of microwave or radar receivers, it is desirable to reduce the frequency of the received microwave signals from the microwave region to a so-called intermediate frequency (IF) region. Such reduction in frequency of the signal characteristic avoids having to transfer such received signals by means of bulky microwave plumbing, and enables processing of the signals by conventional electronic amplifiers (called IF strips). Hence, by means of such IF amplifiers, the level of the received signals can be raised to provide effective signals for signal utilizing means such as control devices and signal display devices. In order to effectively increase the signal levels of such received signals, while minimizing noise levels of signal noise generated within the receiver apparatus, such IF strips are conventionally tuned to a specific IF frequency, and use a local oscillator in cooperation with a frequency mixer to reduce the received microwave signal to such IF frequency. In this way, maximum power transfer and power amplification occur.

Where, however, the mixer output frequency drifts due to a drift in the frequency of the transmitted (received) pulse or of the local oscillator output or both, then such power amplification is not efficiently effected and the output signal quality is deteriorated by transmission through such IF "strips" or stages. Such frequency drifts may occur due to temperature sensitivity of the transmitter and the receiver local oscillator system. Such drift of the IF signal frequency may be reduced by means for providing automatic control of such frequency. However, in the correction of large transient errors in such frequency, it is possible for such frequency control means to attempt to control to a constant IF frequency ($f_{IF}$) determined by either (1) the differences between the frequency ($f_R$) of the received signal and a *higher* frequency ($f_{LO}$) of a controlled local oscillator, or (2) the difference between the frequency ($f_R$) of the received signal and a *lower* frequency ($f_{LO}$) of a controlled local oscillator. In other words, $$f_{IF}=K=f_{LO}-f_R$$

where $$f_{LO}>f_R$$

or $$f_{IF}=K=f_R-f_{LO}$$

where $$f_{LO}<f_R$$

Hence, stable operation of an automatic frequency control means could occur at $f_{IF}=K$, for either $$f_{LO}+f_{IF}=f_R \text{ or } f_{LO}-f_{IF}=f_R$$

However, at one of such IF frequencies such stable operation may be only neutrally stable, whereby the occurrence of a frequency error of a given sense may cause the system to make a change in frequency of the wrong sense in response to such error. In such event, the magnitude of the error is increased.

Further, where large transient errors occur in the IF frequency, not only is it possible for the system to attempt to control to a neutrally stable operating point, but it is also possible for the system to attempt to control to a higher harmonic of an incorrect IF frequency, which incorrect IF frequency is lower than the desired IF. In other words, where the frequency controller is responsive to the harmonics of the IF signal, the frequency control action may only be responsive to the harmonics of the IF signal frequency, whereby the resultant IF frequency represents a sub-harmonic of the desired IF frequency.

The concept of the subject invention provides improved means for generating a regulated IF frequency.

In a preferred embodiment of the invention there is provided a closed loop frequency controller for providing a constant IF frequency characteristic in a pulsed sinusoidal signal, comprising a voltage-controlled local oscillator, and a signal mixer responsive to the local oscillator output and to a pulsed sinusoidal input signal for providing an IF signal having a beat frequency indicative of the difference between the respective frequencies of the input signal and the local oscillator output.

There is also provided control means, including a phantastron circuit, responsive to the output of the mixer and operatively connected to provide a control voltage input to the local oscillator which is indicative of the difference between the beat frequency of the mixer output and a desired IF frequency. There is further provided signal gating means for gating the operation of the phantastron circuit as a function of the sense of the output from the frequency discriminator and the state of the phantastron output to establish control of the local oscillator to only one of several possible frequencies which, when combined with the received signal, provide the desired IF frequency, and including means for suppressing system response to harmonics of a resultant IF frequency.

In one mode of operation of the above described arrangement, the initial scanning action or progressive increase of the phantastron output causes the frequency of the local oscillator to vary or progressively increase, whereby the resultant IF frequency is made to correspondingly scan or vary. The response of the frequency discriminator to the scanning of the IF frequency is employed to set the signal gating means to a second mode of operation, whereby the phantastron may be made to operate as an operational amplifier in closed loop control of the IF frequency only when the frequency of the local oscillator is at or near to a selected one of the possible frequencies resulting in the desired IF frequency. A change in this frequency condition or in the state of the phantastron will reset the gating means, restoring the device to the first mode of operation.

Accordingly, it is a broad object of the subject invention to provide improved frequency control means.

It is also an object of the subject invention to provide means for converting a microwave signal of inconstant frequency to an IF signal of fixed frequency.

It is another object of the invention to provide improved IF phantastron circuit means for control of an IF frequency.

It is still another object of the subject invention to provide means for control of an IF frequency to a selected one of several possible local oscillator frequencies.

It is a further object of the invention to provide means for suppressing response of an automatic frequency controller to harmonics of an undesired IF frequency.

These and other objects of the subject invention will become apparent from the following description taken together with the accompanying drawings in which.

In the figures, like reference characters refer to like parts.

Figure 1:
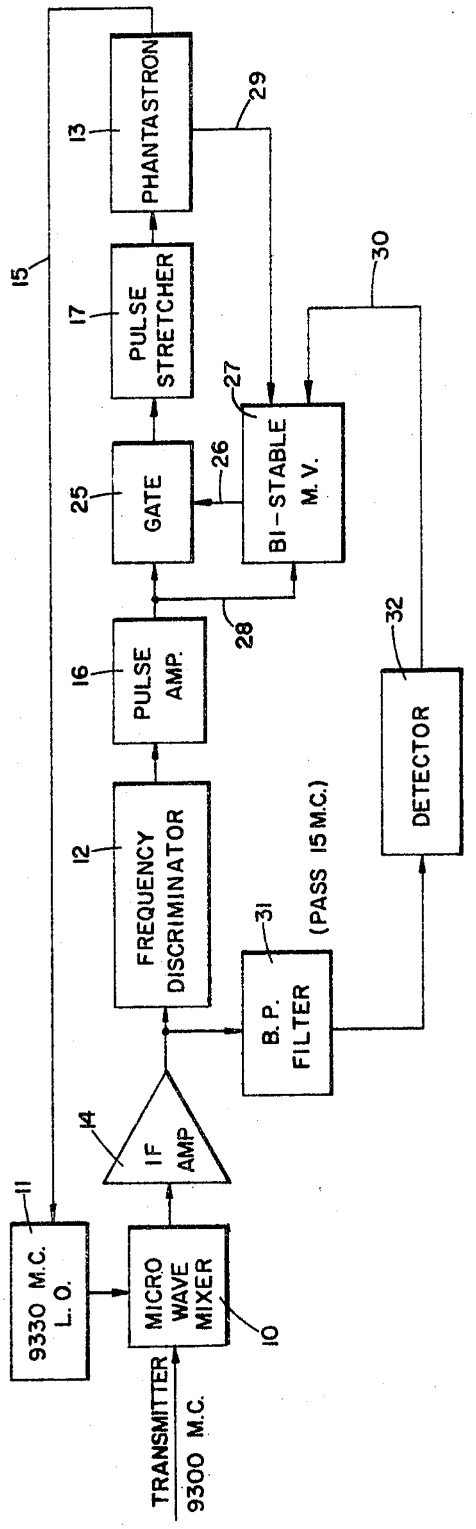
FIG. 1 is a functional block diagram of preferred embodiment of the system.

Referring to FIG. 1, there is illustrated a functional block diagram of a preferred embodiment of the invention. There is provided a microwave mixer 10 having an input responsively coupled to a pulsed microwave energy source (not shown), such as the microwave transmitter of a pulsed microwave radar system. The frequency of such pulsed energy may be 9.3 kilomegacycles per second, for example, although other frequencies could be used. The function of the microwave mixer is to reduce the frequency of the pulsed microwave energy to a constant IF frequency. This is accomplished by further responsively connecting the microwave mixer 10 to a voltage controlled local oscillator 11, the output frequency of which is adjusted so as to maintain the difference between the frequency of the microwave energy source and that of the local oscillator output at a constant value, representing the desired IF frequency.

The frequency of the output from local oscillator 11 is a function of the amplitude of an applied analog input voltage. Therefore, the output frequency from the voltage controlled oscillator 11 may be varied by varying the amplitude of a control voltage applied to the input of oscillator 11.

The construction and arrangement of oscillator 11 and microwave mixer 10 are well-known to those skilled in the art, as is indicated for example in U.S. Patent No. 2,933,980, issued April 26, 1960 to J. R. Moore et al. for an Integrated Aircraft and Fire Control Autopilot. Therefore, these elements are shown in block form only in FIG. 1.

Control means for regulating the IF frequency of the microwave mixer output to a constant value is provided in FIG. 1 by the combination comprising a frequency discriminator 12 responsively coupled to the IF output of mixer 10, and a cyclically scanning phantastron circuit 13 responsively connected to the output of frequency discriminator 12. The function of frequency discriminator 12 is to provide a signal output indicative of the deviation of the pulsed IF input thereto from a desired IF frequency such as, for example, 30 megacycles per second, although other frequencies could be specified. The nature of the discriminator response will be described more fully hereinafter, in connection with FIG. 2. Interposed between the input to discriminator 12 and the output of mixer 10 is an IF amplifier 14. Amplifier 14 is not essential to the concept of the device of FIG. 1, and serves only to assure an adequate signal level for the input signal applied to frequency discriminator 12.

Phantastron element 13 provides a first output signal on line 15 in response to the state of the output signal fed from frequency discriminator 12, to the input of element 13. Such output signal on line 15 is fed to the control input of voltage-controlled oscillator 11. The nature of the response of phantastron 13 will be described more fully hereinafter in connection with FIG. 2. The construction and arrangement of phantastron 13 is well known to those skilled in the art; and is described, for example, at page 64 (including Fig. 3.29) of "Microwave Receivers" by Van Voorhis (volume 23 of the Radiation Laboratory Series) published by McGraw-Hill (1948). Accordingly, this element is shown in block form only in FIG. 1.

A pulse amplifier 16 and pulse stretcher 17 are interposed between the output from frequency discriminator 12 and the input to phantastron 13. The function of pulse stretcher 17 is to provide a signal input to phantastron 13 which is indicative of the sense and magnitude of the pulsed output from discriminator 12, but having a longer duration. Such longer duration is required to provide a control input to phantastron to which it is able to respond. Pulse stretcher 17 may be comprised of a well-known circuit element having a fast charge time compared to the discharge time of the required duration, as will be described more fully hereinafter, in connection with the description of FIG. 3. The function of pulse amplifier 16 is merely to provide an adequate signal level of the output of frequency discriminator 12. The construction and arrangement of discriminator 12, amplifier 16 and pulse stretcher 17 being well known to those skilled in the art, these elements are shown in block form only.

Figures 2, 2A, 2B:
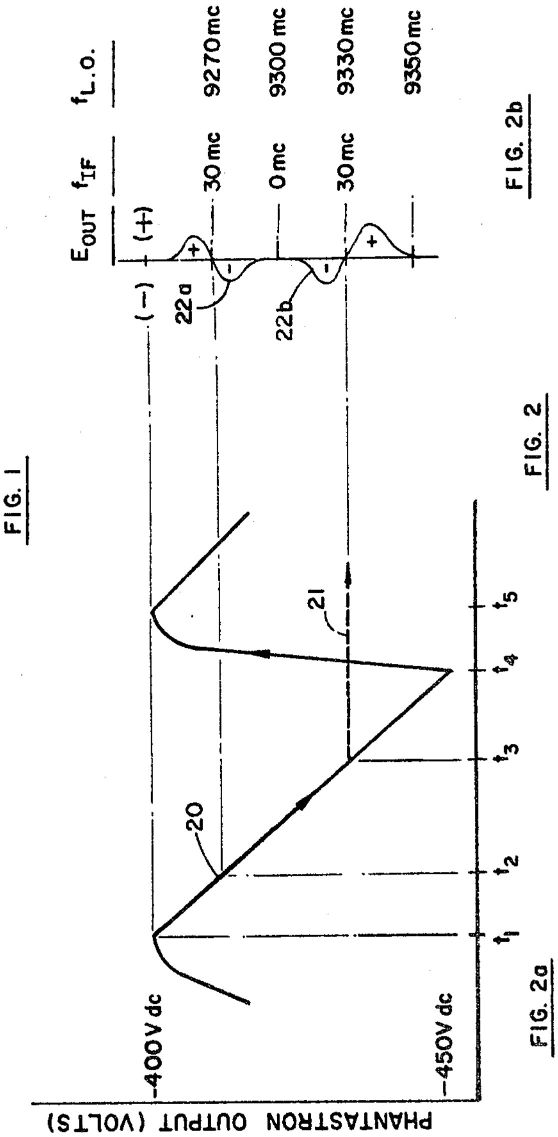
FIG. 2 is a series of response curves illustrating the responses of several elements of FIG. 1.

The operation of the system described above and illustrated in FIG. 1 may be more easily understood by reference to the response curves shown in FIGS. 2*a* and 2*b*.

Referring to FIG. 2, there are illustrated in FIGS. 2*a* and 2*b* the responses of phantastron 13 and discriminator 12 respectively of FIG. 1. In FIG. 2*a* is illustrated the time history of the phantastron response. Curve 20 illustrates the cyclical or periodic "scanning" or ramp function type output signal which results from a phantastron input of a given polarity or sense (say, positive sense), commencing at time, $t_1$. Such a response signal demonstrates an amplitude which constantly increases in time until a maximum negative level is reached (say, at time $t_4$), at which point or condition the phantastron operates to recycle, resetting itself to the condition existing prior to time $t_1$ (which reset condition is shown at time $t_5$) in FIG. 2*a*. Upon reaching such reset condition, the phantastron repeats the previous cycle of operation.

Should the sense of the phantastron input signal be subsequently reversed during such "scanning" mode (e.g., during the time interval from $t_1$ to $t_4$ in FIG. 2*a*), the scanning mode will be interrupted (say at time $t_3$), and the device will then operate in the mode or manner of a D.-C. operational amplifier (as indicated by curve 21), the output thereof fluctuating about a mean value as a direct function of the applied input.

Such modes of operation of a phantastron are well-known to those skilled in the art, as may be seen from the above-mentioned volume 23 of the Radiation Laboratory Series.

Referring to FIG. 2*b*, there is illustrated the frequency response of frequency discriminator 12 of FIG. 1. Curves **22*a* and 22*b* illustrate the amplitude and sense of the D.-C. output or response as a function of the deviation of the frequency of the discriminator IF input from a reference frequency, such as, for example, 30 megacycles. As illustrated, curves 22*a* and 22*b*** show a null or zero amplitude output for inputs of 30 megacycles, with negative-sensed outputs for inputs below 30 megacycles, and positive sense outputs for inputs above 30 megacycles.

Such response characteristics of a frequency discriminator are well known to those skilled in the art. However, it is to be understood that the null or zero amplitude output condition associated with the exemplary 30 megacycle input may occur for either one of two conditions, in the application shown in FIG. 1. A 30 megacycle IF signal output from mixer 10 will occur when the output frequency of local oscillator 11 differs from the frequency of the first input to mixer 10 by 30 megacycles, being either 30 megacycles above or 30 megacycles below the frequency of such first input. For example, if the frequency of the first input is nominally 9300 magacycles, a null can be made to occur at the output of the frequency discriminator 12 for a nominal local oscillator frequency of either 9270 megacycles or 9330 megacycles. Hence, the legend "$f_{LO}$" in FIG. 2*b* refers to nominal local oscillator frequencies corresponding to the IF frequencies shown in FIG. 2*b*, assuming a nominal first input to mixer 10 (in FIG. 1) of 9300 megacycles. Should the frequency of the first input vary, the required local oscillator frequency would, of course, be varied by a like amount.

Hence, it is to be appreciated from FIGS. 2*a* and 2*b* that, in the normal operation of the arrangement illustrated in FIG. 1, phantastron 13 will, in the D.-C. operational amplifier mode, transmit a control signal to local oscillator 11 as provided by frequency discriminator 12, in response to the deviation of the IF frequency output of mixer 10 from a desired IF frequency. The sense of the applied input to voltage-controlled oscillator 11 is selected so as to cause the frequency of oscillator 11 to vary in such a sense or direction as to reduce the deviation between the mixer IF frequency output and the desired IF frequency.

Examples of such operation may be considered for the case of frequency tracking or control to an upper side band of the mixer response (e.g., wherein the desired IF frequency is obtained by maintaining the local oscillator frequency 30 megacycles higher than the frequency of the first input to mixer 11). For example, if the frequency of the local oscillator output were adjusted to 9330 megacycles, and the frequency of the first input to mixer 10 should drift from 9300 megacycles up to 9310 megacycles, causing an IF frequency of (9330–9310) or 20 megacycles or an IF error of −10 megacycles, the resulting sense and amplitude of the input signal to local oscillator 11 would cause the local oscillator frequency to be increased to 9340 megacycles, whereby the desired difference or IF frequency of 30 megacycles is achieved.

Similarly, with a nominal first mixer input frequency of 9300 megacycles, if the frequency of local oscillator 11 should drift from 9330 megacycles down to 9320 megacycles, causing an IF frequency of (9320–9300) or 20 megacycles or an IF error of −10 megacycles, the resulting sense and amplitude of the input signal to local oscillator 11 would cause the local oscillator frequency to be increased to 9330 megacycles, whereby the desired difference or IF frequency of 30 megacycles is achieved.

In other words, the described automatic frequency control device is arranged to "track" or seek a desired IF frequency by causing the local oscillator 11 in FIG. 1 to provide a frequency which is greater than the frequency of the first to mixer 10 by an amount equal to the desired IF frequency.

If, however, a null signal were provided by the output of discriminator 12 due to the frequency of local oscillator 11 being 30 megacycles lower than the frequency of the first input to mixer 10, then an undesirable control condition would exist. Under the condition of a nominal first input of 9300 megacycles to mixer 10, a drift of −10 megacycles in oscillator 11 from 9270 down to 9260 megacycles will not result in an IF frequency of 20 megacycles. Instead, the resulting IF frequency or difference between the local oscillator output and the first mixer input is (9300–9260) or 40 megacycles. Further, and more significantly, the sense of the output from discriminator 12 is *reversed* relative to that associated with the −10 megacycle local oscillator drift from 9330 megacycles for the prior described upper side band case, as is illustrated by curves 22*a* and 22*b* in FIG. 2*b*.

In other words, the automatic frequency control system of FIG. 1 will not operate correctly around the lower side band condition where the local oscillator frequency is less than the frequency of the first microwave input to mixer 10, if the control sense of the system response has been designed for operation about its upper side band condition (e.g., local oscillator frequency greater than that of the first mixer input). Instead, the sense of the control system response is reversed at such lower local oscillator frequency thus preventing proper operation in reducing IF frequency errors.

In normal design practice, it is intended that the local oscillator 11 be allowed to sweep through only a limited range of frequencies, as is represented for example by the $f_{LO}$ region in FIG. 2*b* of 9300 to 9350 megacycles per second. However, the performance of local oscillator 11 to within such a restricted band of frequencies is difficult to maintain, due to transients in the response of the automatic frequency control system of FIG. 1 and also due to the temperature sensitivity of both the local oscillator and the transmitter (not shown) associated with the radar receiver employing such automatic frequency control system. Further, where the transmitter is tunable (e.g., transmitter frequency is adjustable), tuning adjustments in the transmitter may result in a selected narrow performance range of local oscillator frequencies becoming incorrect. Further, the use of a broad range of local oscillator scanning frequencies would include a lower as well as an upper, local oscillator frequency deviating from the transmitter frequency by the amount of the desired IF frequency. Hence, the likelihood of improper control action arises, as indicated by the exaggerated range of the phantastron scanning action shown in FIG. 2*a*, resulting in the associated response of FIG. 2*b*. Accordingly, means are required to allow such broad range of scanning while preventing such improper control action.

Referring again to FIG. 1, there is illustrated means for preventing control about a lower side band of discriminator 12, including means for preventing the local oscillator 11 "tracking," or being controlled to, a microwave frequency below that of the first microwave input to mixer 10. Signal gating means 25 is interposed between the output of pulse amplifier 16 and the input to pulse stretcher 17 for gating or controlling the transmission of input signals to phantastron 13 in response to control signals applied to a control input 26 of gating means 25. There is further provided bistable signalling means 27 for providing a two-state signal output on line 26.

A first input line 28 of signalling means 27 is connected to the output of pulse amplifier 16 and a "reset" input signal line 29 of element 27 is connected to phantastron 13.

In normal operation of the above described arrangement, bistable signalling means (reference numeral 27) turns-on gate 25 in response to input signals of a given sense, say negative sense, on input line 28. Hence, line 28 in feeding a negative signal input to bistable means 27, serves as enabling means to enable gate 25 to be closed, thereby allowing closed-loop operation of the automatic frequency control system of FIG. 1. In other words, the output state of bistable signalling means may be changed from the "OFF" state to the "ON" state by the application of an input signal of negative sense on line 28.

If, however, a positive polarity input signal is applied to line 28, bistable signalling means 27 would remain in the "OFF" state. Such positive input might correspond, for example, to the output of frequency discriminator 12 (in cooperation with pulse amplifier 16) associated with a local oscillator frequency below 9270 megacycles (as illustrated by curve 22*a* in FIG. 2*b*) in response to the scanning action of phantastron 13 (as illustrated by curve 20 for the time interval between $t_1$ and $t_2$ in FIG. 2*a*). As the scanning action of phantastron 13 continues (curve 20 between $t_2$ and $t_3$ of FIG. 2*a*), the sense of the output from frequency discriminator 12 changes from a positive sense and provides a negative sense (curves 22*a* and 22*b* between local oscillator frequencies 9270 megacycles and 9330 megacycles), which negative signal provides an enabling signal input to bistable signalling means 27. Bistable means 27 responds to the enabling signal on line 28, turning on gate 25. Such closing of gate 25 does not interrupt the sweep mode of phantastron 13 but enables the subsequent operational amplifier mode of phantastron 13 to close the automatic frequency control loop, as is explained more fully hereinafter.

In the region of $t_3$ of the phantastron response (curve 20 of FIG. 2*a*, corresponding to the null (zero amplitude) region of the discriminator response curve 22*b* in FIG. 2*b*, associated with a local oscillator frequency of about 9330 megacycles), the phantastron will operate as an operational amplifier, whereby the frequency control loop functions as a closed loop proportional controller. If, however, the frequency of local oscillator 11 of FIG. 1 were to increase slightly above 9330 megacycles corresponding to an increase in IF frequency output of mixer 10 to slightly above 30 megacycles, the corresponding removal of the "enable" signal (e.g., either a null or a sense reversal of the signal on line 28) will not cause a change in state of the output of bistable signalling means 27. If, on the other hand, the IF frequency error resulting from an increase in the IF frequency above the desired 30 megacycles should become so great as to cause phantastron 13 to recycle (corresponding to curve 20 of FIG. 2*b* between $t_4$ and $t_5$), then a signal indicative of such condition is fed from phantastron 13 on line 29 to reset bistable means 27, causing a change of state of the two-state sgnal on line 26, whereby gate 25 is switched off. Such large frequency error or transient might occur, for example, where the radar transmitter "misses" a pulse and no received first input occurs at mixer 10. In such event of phantastron 13 recycling through the scanning mode, bistable signalling means 27 and signal gating means 25 would cooperate as before, whereby the system of FIG. 1 is prevented from improperly controlling to the null condition of frequency discriminator 12, corresponding to a local oscillator frequency of 9270 megacycles in FIG. 2*b*.

Hence, it is to be appreciated that the cooperation of gating means 25 and bistable means 27 with phantastron 13 prevents the system from controlling to a lower side band IF frequency produced by maintaining the frequency of local oscillator 11 below that of the first microwave input to mixer 10.

If, however, the output response of microwave mixer 10 in FIG. 1 contains harmonics of the difference frequency or IF outputs, it is yet possible for the closed loop control mode to cause local oscillator 11 to "track" in response to an upper side band IF frequency of less than the desired value and having a harmonic of the desired frequency. For example, local oscillator 11 might be controlled to a frequency (say, 9315 megacycles) which is above that of the first microwave input mixer 10 (say, 9300 megacycles), thereby producing a low frequency IF of 15 megacycles and having a first harmonic of 30 megacycles. The response of discriminator 12 to such harmonic would provide a control signal causing the system to null to such harmonic, whereby local oscillator 11 would be caused to track or follow a microwave frequency (say of 9315 megacycles), and maintaining a fundamental frequency of only 15 megacycles at the output of mixer 10. In other words, control is maintained to a frequency representing a sub-harmonic of the desired IF frequency. Accordingly, means is required to suppress or prevent such adverse response characteristic.

Referring again to FIG. 1, there is further illustrated means for preventing control to a frequency representing a sub-harmonic of a desired IF frequency. There is provided a signal source responsive to a sub-harmonic of the desired IF frequency for providing a second reset signal on line 30 to bistable signalling means 27. Such second source of a reset signal comprises filter means 31 (such as a band pass filter or low pass filter) responsively connected to the output of mixer 10 for transmitting output signals of no greater frequency than the first sub-harmonic of the desired IF frequency. The output, if any, of filter 31 is fed to a signal detector 32. Signal detector 32, in response to an IF signal input from filter 31, provides an analog signal of suitable sense or polarity on line 30 for resetting bistable signalling means 27.

The construction and arrangement of elements 31 and 32 are well known in the art, and therefore such elements are illustrated in FIG. 1 in block form only.

By means of the arrangement of filter 31 and detector 32 illustrated in FIG. 1, bistable means 27 will turn off gate 25 in response to reset signals on line 30, indicating the presence of low frequency signals having harmonics in the IF frequency region of interest. Hence, it is to be appreciated that means is provided for preventing local oscillator 11 in FIG. 1 from tracking microwave frequencies which produce IF frequencies representing sub-harmonics of a desired IF frequency.

Figure 3:
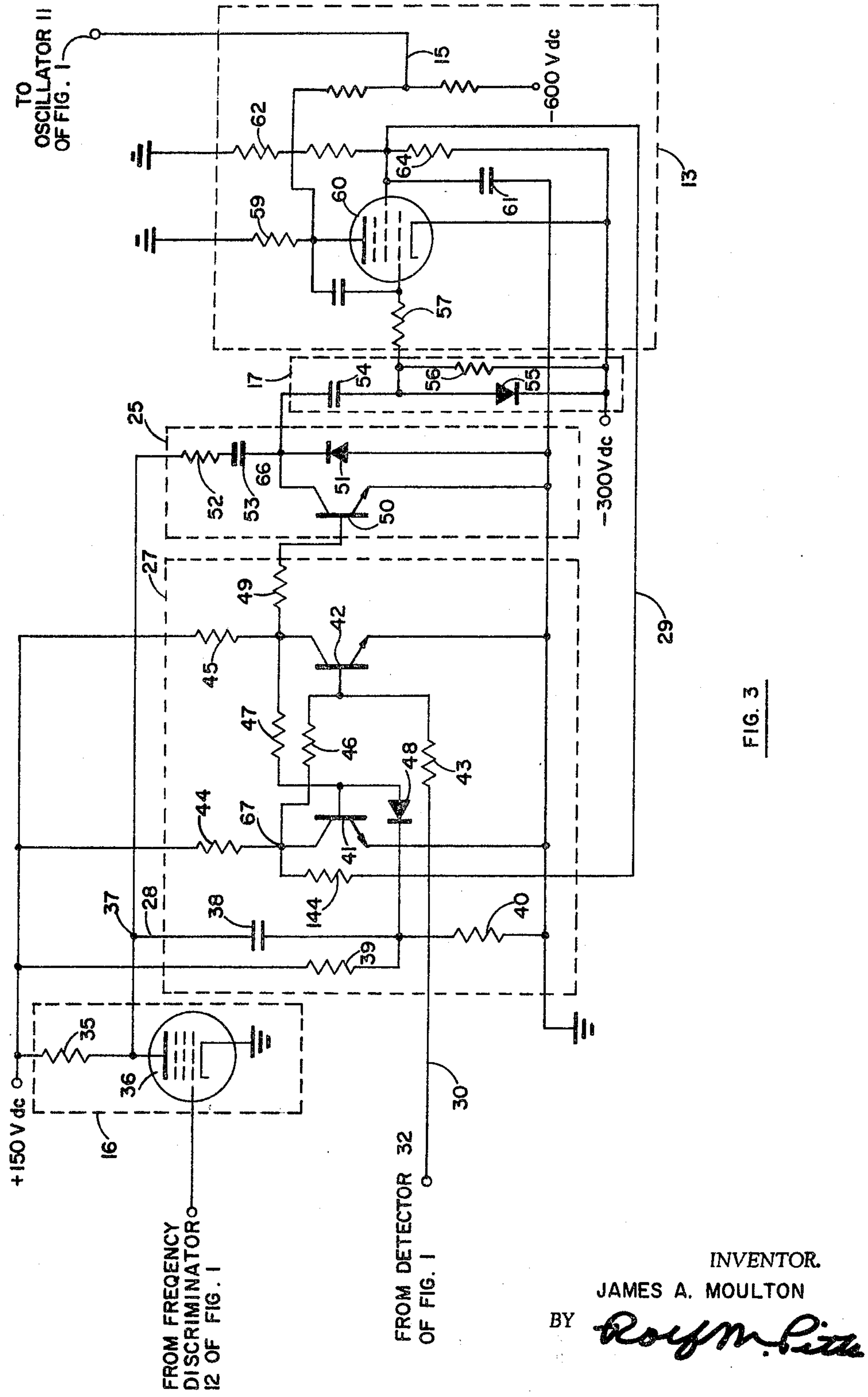
FIG. 3 is a schematic diagram of a preferred embodiment of the bistable logic element of FIG. 1.
Figure 4:
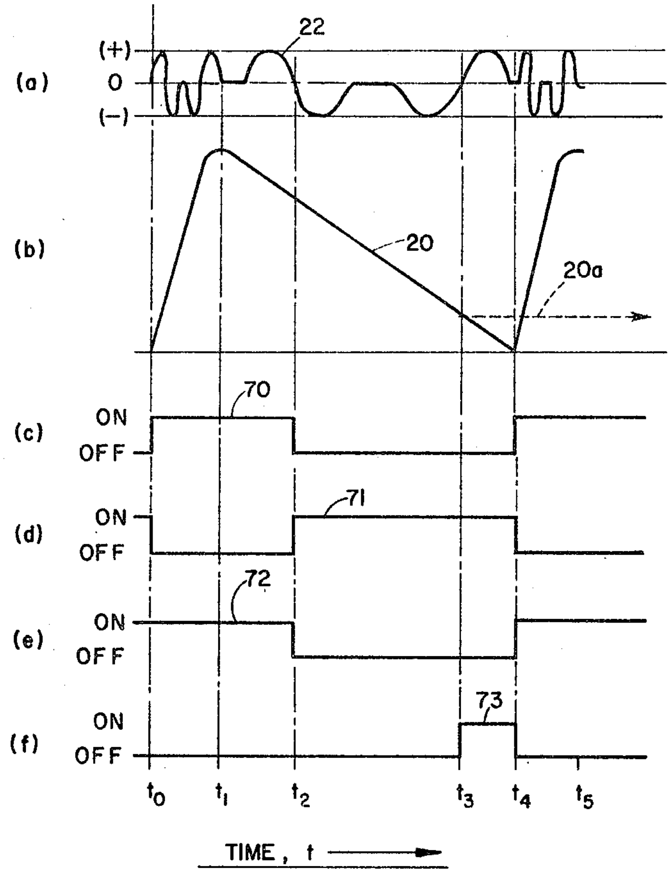
FIG. 4 is a time history of the various signals associated with phantastron circuit of FIG. 1.

A preferred embodiment of the bistable signalling means of FIG. 1 is shown in FIG. 3, the operation of which may be more easily explained by reference to the time histories thereof illustrated in FIG. 4.

FIG. 3 illustrates a schematic diagram of a preferred embodiment for bistable means 27 and signal gating means 25, shown in cooperation with an examplary pulse amplifier 16, pulse stretcher 17 and phantastron 13 of the AFC system of FIG. 1. The illustrated interconnection of two transistors 41 and 42 form a bistable multivibrator circuit 27 with current supplied from a source of +150 v. D.-C. through resistors 44 and 45. However, a portion of the current through resistor 44 flows through resistor 144 to the screen grid of the phantastron tube 60. At the end of each linear phantastron sweep of phantastron 13, recycle occurs and the screen current of vacuum tube 60 increased.

During the recycle period of phantastron 13 (period $t_0$ to $t_1$ in FIG. 4), the screen voltage of tube 60 drops from −180 volts to −280 volts (e.g., drops from +120 volts to +20 volts with respect to its cathode), causing the voltage at the collector of transistor 41 of multivibrator 26 to drop to zero or slightly therebelow. Therefore, transistor 42 (curve 71 between $t_0$ and $t_1$ in FIG. 4) becomes non-conductive because no base current is supplied through resistor 46.

When transistor 42 is "open" or non-conductive, current supplied through resistor 45 from the +150 volt D.-C. source flows through resistor 47 to the base of transistor 41 and through resistor 49 to the base of transistor 50. The current in the base of transistor 50 causes collector-emitter junction saturation of transistor 50 which effectively shunts to ground any positive pulse (from amplifier 16) attempting to appear at the junction 66 of capacitors 53 and 54. Negative going pulses at junction 66 are shunted to ground through diode 51. Therefore, pulse outputs from inverter-amplifier 16 are not applied to the pulse-stretcher network comprising diode 55, resistor 56 and capacitor 54 (curve 73 from $t_0$ to $t_1$ in FIG. 4). In other words, during recycling of phantastron 13, signal gate 25 is "open" or "off" (curve 73 from $t_0$ to $t_1$ in FIG. 4) and the phantastron 13 is unaffected by either negative or positive pulses appearing at the plate of tube 36 (of amplifier 16).

As the phantastron tube 60 starts the next linear sweep (curve 20 at $t_1$ in FIG. 4), its screen current decreases and the associated screen voltage rises to approximately −180 volts (+120 with respect to the cathode). The screen voltage of phantastron tube 60 will remain at approximately −180 volts during the sweep and also when the phantastron is performing as a D.-C. amplifier. At this time, positive current is available at the junction 67 of resistors 44 and 144. However, since a base current is present in transistor 41, the collector-emitter junction of transistor 41 is saturated (curve 70 at $t_1$ in FIG. 4), due to the collector voltage being clamped to zero. Therefore, no current is supplied to the base of transistor 42. Since no current continues to be supplied to the base of transistor 42, transistor 42 continues to remain "open" and transistors 41 and 50 remain saturated (curves 70 and 72, respectively between $t_1$ and $t_2$ in FIG. 4), which condition defines a first stable state. This stable state will continue (even if the phantastron recycles) until a negative pulse from amplifier 16 (curve 22 from $t_2$ to $t_3$ in FIG. 4) is applied ot the base of transistor 41.

After the phantastron sweep has caused the IF frequency to pass through a negative discriminator output (as seen at the output of inverter-amplifier 16 and as illustrated in FIG. 2*b*), the logic circuit will allow subsequent positive pulses from amplifier 16 (curve 22 between $t_3$ and $t_4$ in FIG. 4) to be applied to the pulse-stretcher network 17, so that microwave frequency tracking or IF lock-on may be effected by the system of FIG. 1. This is accomplished by the coupling of negative going pulses from the plate of tube 36 through capacitor 38 and diode 48 to the base of transistor 41. Once transistor 41 is cut off, current flows from the junction 67 of resistors 44 and 144 through resistor 46 to the base of transistor 42, causing transistor 42 to saturate (curve 71 at $t_2$ in FIG. 4). The saturation of transistor 42 thus removes the current formerly applied to the base of each of transistors 41 and 50, establishing a second stable state with transistor 42 "on" (curve 71 at $t_2$ in FIG. 4) and transistors 41 and 50 (curves 70 and 72 respectively at $t_2$) "off."

As the phantastron sweep continues (curve 20 at $t_3$ in FIG. 4), positive pulses (curve 22 at $t_3$) will appear at the plate of pulse amplifier 16 when the IF frequency input to frequency discriminator 12 of FIG. 1 sweeps above 30 mc. These positive pulses are now coupled through capacitors 53 and 54 (curve 73 between $t_3$ and $t_4$) where the positive peak is clamped to −300 by diode 55. Capacitors 53 and 54 then discharge through resistor 56, developing a stretched pulse of negative polarity (through resistor 57) at the grip of phantastron tube 60. In response to such negative pulse input, tube 60 stops sweeping and acts as a D.-C. amplifier (curve 20*a* in FIG. 4).

During the above-described "off" condition of transistor 50 (curve 72 between $t_2$ and $t_4$), diode 51 has no effect on the pulse amplitude appearing at the junction 66 of capacitors 53 and 54. Instead diode 51 merely clamps the signal to ground, establishing the positive signal swing appearing at the collector of transistor 50 at the pulse amplitude on the plate of amplifier tube 68.

The detail functions of several other elements of the circuit of FIG. 3 are further described. The function of resistor 52 is to allow a negative pulse to be developed at the plate of tube 36 when transistor 50 is saturated. In other words, without the employment of resistor 52, no pulse could occur at the plate of tube 36 when transistor 50 is saturated, because such plate would be shorted to ground, thereby preventing switching of the signal state of gate 25. Resistors 39 and 40 establish a back bias across diode 48 that prevents system transients present in the 150 v. D.-C. source or which are coupled from the heater to cathode in tube 36 or in discriminator 12 (of FIG. 1) from erroneously cutting off transistor 42.

Capacitor 61 smooths the screen grid waveform (from tube 60) applied to transistor 41 through resistor 144 so that capacitive unbalance in multivibrator 27 will not cause the multivibrator output to assume the wrong signal state at the end of the phantastron recycle period. Capacitor 61 also attenuates transients occurring on the −300 v. D.-C. supply so that they do not erroneously switch multivibrator 27.

In order to eliminate IF lock-on at 15 mc., a 15 mc. "reject" pulse is required by the logic circuit of FIG. 3, as explained hereinabove in connection with the description of FIG. 1.

The output of negative detector 32 (of FIG. 1) on line 30 is coupled through resistor 43 to the base of transistor 42. In the event of attempted IF lock-on at 15 mc., the resultant negative pulse on line 30 will cut transistor 42 "off." In such event, current is then supplied through resistor 45 to transistors 41 and 50, establishing a stable state of multivibrator 27, which results in signal gate 25 shunting a signal pulse at terminal 66. Therefore, the phantastron will sweep until the IF output of amplifier 16 passes through the desired range of frequencies producing the proper negative-positive discriminator response sequence enabling AFC IF lock-on at 30 mc.

Means has been described and illustrated for preventing frequency control to an undesired sideband frequency or undesired harmonic of a desired frequency in an automatic frequency controller. Accordingly, it is to be seen that the device of this invention provides improved and novel means for regulating and controlling the signal frequency of a periodic signal source.

Although the invention has been described and illustrated in detail, it is to be clearly understood that the same is by way of illustration and example only, and is not to be taken by way of limitation, the spirit and scope of this invention being limited only by the terms of the appended claims.

I claim:

1. A closed loop automatic frequency controller for providing a constant IF frequency characteristic in a pulsed sinusoidal signal comprising
   - a voltage controlled local oscillator for generating a signal having a frequency indicative of a control voltage,
   - a signal mixer responsive to a sinusoidal input signal and an output of said local oscillator for providing a signal having a beat frequency indicative of the difference between the respective frequencies of said input signal and said local oscillator output,
   - control circuit means including a phantastron circuit and responsive to said output of said mixer and operatively connected to provide a control voltage input to said local oscillator which is indicative of the difference between the beat frequency of said mixer output and a reference frequency, whereby the frequency of said local oscillator tends to vary so as to maintain a constant IF frequency at the output of said mixer,
   - bistable gating means disconnectably intercoupling said output of said discriminator and an input of said control means for restricting control of said local oscillator in response to the phase-sense of the low frequency response only of said frequency discriminator and in further response to an abnormally high negative level of the output of said phantastron circuit.

2. The device of claim 1 including means for suppressing frequency controller response to a harmonic of an IF mixer frequency thereby avoiding generation of an IF frequency indicative of a sub-harmonic of the reference IF frequency.

3. The device of claim 1 further including
   - signal detector means responsive to a sub-harmonic of said reference IF frequency,
   - said gating means being further responsively connected to said signal detector means for suppressing operation of said control means in response to said sub-harmonic.

4. The device of claim 1 including
   - gating means for functionally disabling said automatic frequency controller,
   - second means for distinguishing said an upper side band response of said frequency discriminator from a lower side band response of the same,
   - third means for detecting an IF signal having a harmonic of like frequency as a reference IF frequency,
   - said gating means being responsively connected to said second means for restricting control of said frequency controller to a selected one of said side band responses of said frequency discriminator,
   - said gating means being further responsively connected to said third means for suppressing control of said automatic frequency controller to said harmonic.

5. In an automatic IF frequency controller having a frequency discriminator responsively connected to a signal frequency mixer in cooperation with a phantastron circuit for control of the voltage-controlled local oscillator of said automatic IF frequency controller, means for restricting control of said local oscillator response to the higher one of the discriminator side band responses capable of being caused by said local oscillator comprising
   - bistable circuit means having a two-state output, said bistable circuit means being responsive to the phase-sense of the response of said frequency discriminator for establishing a first one of said two-states, said bistable circuit means being further responsive to said phantastron circuit for switching to a second one of said two states, and
signal gating means interposed between the output of said frequency discriminator and the input to said phantastron circuit and responsively connected to the output of said bistable circuit means.

6. In an automatic IF frequency controller having a frequency discriminator responsively connected to a signal frequency mixer in cooperation with a phantastron circuit for control of the voltage-controlled local oscillator of said automatic IF frequency controller, means for restricting control of said local oscillator response to only one of the discriminator side band responses capable of being caused by said local oscillator comprising
bistable circuit means having a two-state output, said bistable circuit means being responsive to the phase-sense of the low frequency response only of said frequency discriminator for providing a first one of said two states, said bistable circuit means being further responsive to said phantastron circuit for providing a second one of said two states, and
signal gating means for connecting and disconnecting the output of said frequency discriminator to the input of said phantastron circuit in response to said first and second state respectively of said bistable circuit means.

7. The device of claim 6 further including means for suppressing frequency controller response to a sub-harmonic of a reference frequency.

8. The device of claim 6 further including
low frequency band pass means for detecting an IF signal having a harmonic of like frequency as a reference IF frequency, and
said bistable circuit means being responsively connected to said band pass means for providing said second state.

9. The device of claim 6 wherein said bistable circuit means comprises
first and second bistable transistors,
first, second and third input terminals,
an output terminal connected to said second transistor,
unidirectional conducting means interconnecing said first input terminal to the base electrode of said first transistor for providing only a first signal state on said output terminal in response to only inputs of a preselected sense applied to said first input terminal,
first impedance coupling means interconnecting said second input terminal and one of the collector and emitter electrodes of said first transistor for providing a second signal state on said output terminal in response to inputs of a preselected sense applied to said second input terminal, and
second impedance coupling means interconnecting said third input terminal and the base electrode of said second transistor for providing a second signal state on said output terminal in response to inputs of a preselected sense applied to said third input terminal.

10. The device of claim 6 wherein said bistable circuit means comprises
first, second and third input terminals,
an output terminal,
a common input-output terminal,
first and second transistors,
a first one of the collector and emitter electrodes of each of said transistors being commonly connected to said common terminal,
a second one of the collector and emitter electrodes of each of said transistors being commonly connected to a direct current source of potential,
a series resistor interposed in series circuit with each said second electrodes,
a first coupling resistor interconnecting the base electrode of said first transistor and said second electrode of said second transistor,
a second coupling resistor interconnecing the base electrode of said second transistor and said second electrode of said first transistor,
said output terminal being connected to said second electrode of said second transistor,
unidirectional conducting means interconnecting said first input terminal and the base electrode of said first transistor,
first impedance coupling means interconnecting said second input terminal and said second electrode of said first transistor,
second impedance coupling means interconnecting said third input terminal and said base electrode of said second transistor,
said first and second input terminals being connected to the outputs of said frequency discriminator and said phantastron respectively, and said output terminal being connected to a control electrode of said signal gating means.

11. The device of claim 6 wherein the combination of said bistable circuit means and said signal gating means comprises
first, second and third input terminals,
an output terminal,
a common input-output terminal,
first, second and third transistors,
a first one of the collector and emitter electrodes of each of said transistors being commonly connected to said common terminal,
a second one of the collector and emitter electrodes of each of said first and second transistors being commonly connected to a direct current source of potential,
a series resistor interposed in series circuit with each said second electrode of said first and second transistor,
a series connected capacitor and resistor interconnecting said first input terminal and said second electrode of said third transistor,
a first coupling resistor interconnecting the base electrode of said first transistor and said second electrode of said second transistor,
a second coupling resistor interconnecting the base electrode of said second transistor and said second electrode of said first transistor,
a third coupling resistor interconnecting the base electrode of said third transistor and said second electrode of said second transistor,
said output terminal being connected to said second electrode of said third transistor,
first unidirectional conducting means interconnecting said first input terminal and the base electrode of said first transistor,
second unidirectional conducting means connected across said first and second electrodes of said third transistor,
first impedance coupling means interconnecting said second input terminal and said second electrode of said first transistor,
second impedance coupling means interconnecting said third input terminal and said base electrode of said second transistor,
said first and second input terminals being connected to the outputs of said frequency discriminator and said phantastron respectively, said third input terminal being adapted to be connected to a signal source for gating said third transistor, and said output terminal being connected to an input of said phantastron.

12. A frequency control device comprising a frequency discriminator; bistable means for gating the output of the frequency discriminator, said bistable means having a first input responsive to a preselected polarity of output signals of said discriminator to gate-on said gated discriminator output; and means for providing a varying signal in response to the gated output of said frequency discriminator, a second input of said gating means being responsive to a preselected signal level of said varying signal to gate-off said gated discriminator output; and a mixer, said frequency discriminator connected to be responsive to the output of said mixer; a variable oscillator connected to provide an input to said mixer and further connected to be responsive to the output of said means providing a variable signal; and band pass filter means responsive to the output signals provided to said mixer; and means operable in response to said band pass filter to cause said gating means to not conduct whereby a selected frequency is not provided by said mixer.

References Cited by the Examiner

UNITED STATES PATENTS

| | | | |
|---|---|---|---|
| 2,852,669 | 9/1958 | Ashby | 325—423 X |
| 2,897,449 | 7/1959 | Larkin | 331—4 |
| 3,174,105 | 3/1965 | Morgan | 325—420 |

KATHLEEN H. CLAFFY, *Primary Examiner.*

ROBERT H. ROSE, *Examiner.*

R. LINN, *Assistant Examiner.*